(12) United States Patent
Suzuki (10) Patent No.: US 8,847,640 B2
(45) Date of Patent: Sep. 30, 2014

(54) TRIGGER SIGNAL DETECTION APPARATUS

(71) Applicant: Kabushiki Kaisha Toshiba, Tokyo (JP)

(72) Inventor: Yoshihide Suzuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/922,429

(22) Filed: Jun. 20, 2013

(65) Prior Publication Data

US 2013/0278313 A1    Oct. 24, 2013

Related U.S. Application Data

(62) Division of application No. 12/634,826, filed on Dec. 10, 2009, now Pat. No. 8,493,094.

(30) Foreign Application Priority Data

Dec. 10, 2008  (JP) ................................. 2008-314538

(51) Int. Cl.
*H03L 7/00* (2006.01)
*G06F 1/04* (2006.01)

(52) U.S. Cl.
CPC ... *H03L 7/00* (2013.01); *G06F 1/04* (2013.01)
USPC .............................. 327/141; 327/27; 327/261

(58) Field of Classification Search
USPC ........................................ 327/23, 24, 27, 261
See application file for complete search history.

(56) References Cited

U.S. PATENT DOCUMENTS

| | | | |
|---|---|---|---|
| 4,236,057 A * | 11/1980 | Inoue | 219/69.13 |
| 4,338,529 A * | 7/1982 | Fujibayashi | 327/100 |
| 4,376,880 A * | 3/1983 | Inoue | 219/69.17 |
| 5,031,128 A * | 7/1991 | Boutigny et al. | 708/212 |
| 5,661,673 A | 8/1997 | Davis | |
| 5,867,051 A * | 2/1999 | Liu | 327/333 |
| 6,879,201 B1 * | 4/2005 | Chan | 327/291 |
| 2004/0070580 A1 | 4/2004 | Minami | |
| 2006/0123188 A1 * | 6/2006 | Obinata | 711/106 |
| 2008/0178055 A1 | 7/2008 | Nakamura | |

FOREIGN PATENT DOCUMENTS

JP    2002-141789    5/2002

OTHER PUBLICATIONS

U.S. Office Action mailed Dec. 23, 2012 corresponding to U.S. Appl. No. 12/634,826, filed Dec. 10, 2009.
U.S. Office Action mailed Apr. 18, 2012 corresponding to U.S. Appl. No. 12/634,826, filed Dec. 10, 2009.
U.S. Office Action mailed Nov. 23, 2012 corresponding to U.S. Appl. No. 12/634,826, filed Dec. 10, 2009.

* cited by examiner

*Primary Examiner* — Ryan Jager
(74) *Attorney, Agent, or Firm* — White & Case LLP (57) ABSTRACT

A trigger signal detection apparatus includes: a clock gating circuit which is supplied with a trigger signal and a clock signal and outputs the clock signal; a trigger signal processing circuit which outputs a first signal only for a predetermined time when the clock signal is supplied from the clock gating circuit; a counter which operates in response to the trigger signal, thus outputting a count value of the clock signal; and a time set-up circuit which outputs a second signal to the trigger signal processing circuit when count value supplied from the counter reaches a preset value, and the trigger signal processing circuit stops outputting the first signal when the trigger signal processing circuit receives the second signal.

2 Claims, 8 Drawing Sheets

TRIGGER SIGNAL DETECTION APPARATUS

CROSS REFERENCE TO RELATED APPLICATIONS

This application is a Division of application Ser. No. 12/634,826 filed Dec. 10, 2009, the entire contents of which are hereby incorporated by reference.

This application claims benefit of priority under 35 USC §119 to Japanese Patent Application No. 2008-314538, filed on Dec. 10, 2008, the entire contents of which are incorporated by reference herein.

BACKGROUND OF THE INVENTION

1. Field of the Invention

The present invention relates to a trigger signal detection apparatus.

2. Related Background Art

For example, a trigger signal detection apparatus is widely used, which receives as a trigger signal a signal that represents a detection of a trouble in an external device etc, outputs a signal that stays at a high level for a predetermined time since the reception of the signal, stops the output of the high level signal after the predetermined time elapses, and outputs a low level signal or one-shot pulse. This type of apparatus has been used for such a control to stop the driving of a motor for a predetermined time when a trouble is detected and, after the predetermined time elapses, restart the driving.

However, in one of the prior art of the trigger signal detection apparatus, once a clock signal for counting the predetermined time is supplied, all of circuits in the apparatus operate all the time, so there causes a problem in that unnecessary power is dissipated wastefully.

A variety of techniques are proposed to reduce the dissipation power of the apparatus; for example, Japanese Patent Laid Open Publication No. 2002-141789 discloses a technique to decrease the dissipation power of an apparatus that detects a transiting edge position and then operates based on the detected edge position. However, Japanese Patent Laid Open Publication No. 2002-141789 does not refer to a trigger signal.

Another prior art of the trigger signal detection apparatus has performed clock gating at a stage of receiving a clock signal at necessary timing only when the clock signal is supplied, for suppressing dissipation power. However, to perform clock gating, a clock enable signal is required, so a new circuit block is inevitable to generate the clock enable signal. This has resulted in a problem in that the apparatus as a whole would be increased in size and could not effectively be decreased in costs including the dissipation power.

SUMMARY OF THE INVENTION

According to a first aspect of the present invention, there is provided a trigger signal detection apparatus comprising:

a clock gating circuit which is supplied with a trigger signal and a clock signal and outputs the clock signal;

a trigger signal processing circuit which outputs a first signal only for a predetermined time when the clock signal is supplied from the clock gating circuit;

a counter which operates in response to the trigger signal, thus outputting a count value of the clock signal; and a time set-up circuit which outputs a second signal to the trigger signal processing circuit when count value supplied from the counter reaches a preset value, wherein the trigger signal processing circuit stops outputting the first signal when the trigger signal processing circuit receives the second signal.

DETAILED DESCRIPTION OF THE INVENTION

Hereafter, some of embodiments of the present invention will be described more specifically with reference to the drawings. Identical reference numerals are given to identical components in the drawings, and repetitive description on the identical components will not be repeated.

(1) First Embodiment

Figure 1:
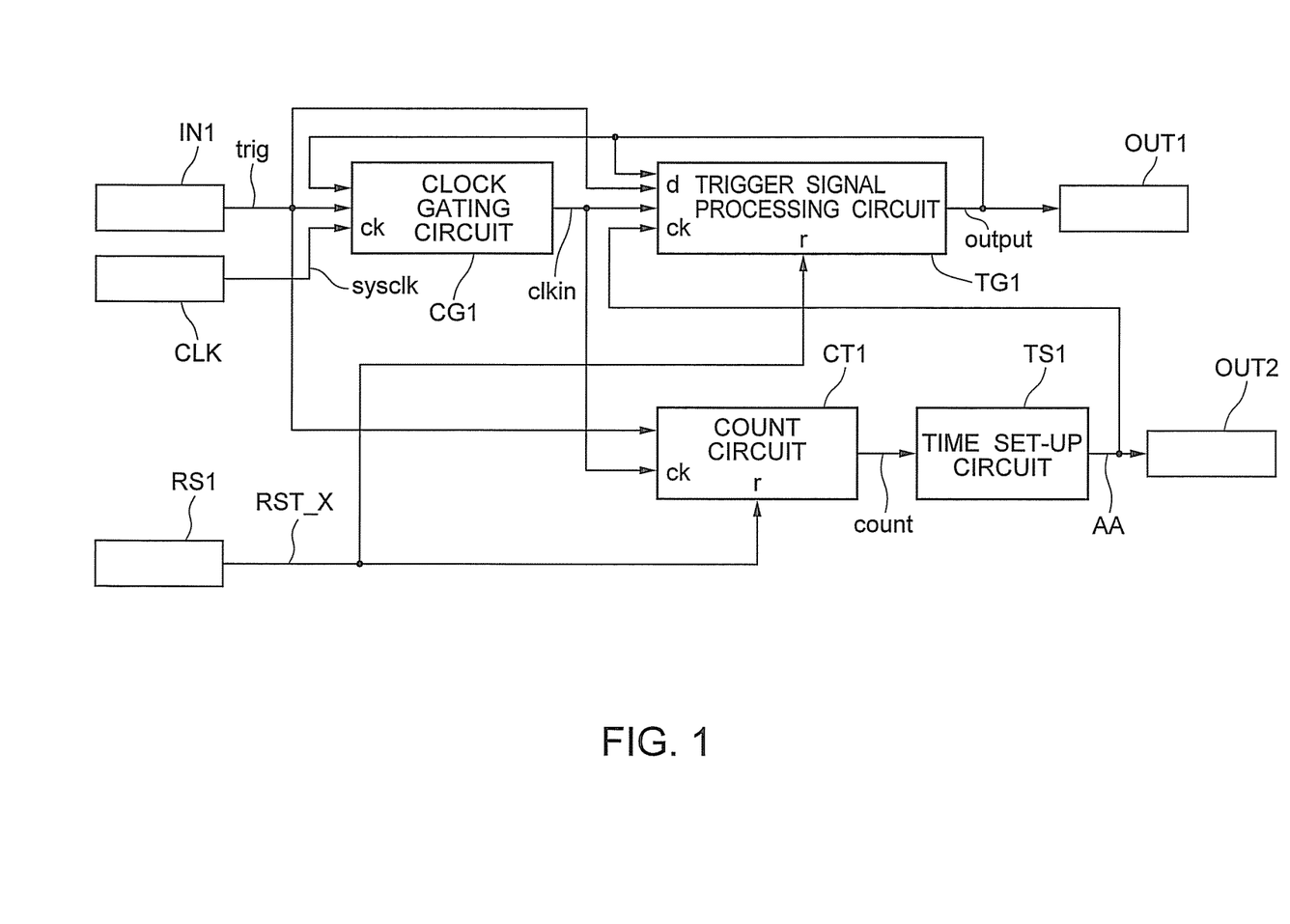
FIG. 1 is a block diagram showing an outlined constitution of a trigger signal detection apparatus according to a first embodiment of the present invention.

FIG. 1 is a block diagram showing the outlined constitution of a trigger signal detection apparatus according to a first embodiment of the present invention. The trigger signal detection apparatus shown in FIG. 1 starts outputting a first signal with a high level when a trigger signal is supplied, and continues the output of the first signal for an arbitrarily set-up time even after the trigger signal is turned off.

Then, when the trigger signal is turned off after this arbitrarily set-up time has elapsed, the trigger signal detection apparatus shown in FIG. 1 outputs a second signal as one-shot pulse, and stops the output of the first signal.

First, a description will be given of the outlined constitution of the trigger signal detection apparatus shown in FIG. 1.

The trigger signal detection apparatus shown in FIG. 1 comprises an input circuit IN1 that inputs a variety of signals to the following various circuits as an input signal, input terminals CLK and RS1, a clock gating circuit CG1 that processes those input signals, a trigger signal processing circuit TG1, a count circuit CT1, a time set-up circuit TS1, and output terminals OUT1 and OUT2 that output the input signals processed by those circuits as an output signal.

It is to be noted that the input signals specifically refer to a reset signal RST_X, a trigger signal "trig", and a system clock signal "sysclk"; the reset signal RST_X is inputted from the input terminal RS1 to the trigger signal processing circuit TG1 and the count circuit CT1, while the trigger signal "trig"

is inputted from the input circuit IN1 to the clock gating circuit CG1, the trigger signal processing circuit TG1, and the count circuit CT1. The system clock signal "sysclk" is inputted from the input terminal CLK to the clock gating circuit CG1.

On the other hand, the output signals specifically refer to a signal output and a one-shot pulse "AA"; the signal "output" is outputted from the output terminal OUT1 via the trigger signal processing circuit TG1 and the one-shot pulse "AA" is outputted from the output terminal OUT2 via the time set-up circuit TS1.

Next, a description will be given of operations of the trigger signal detection apparatus shown in FIG. 1.

First, when the reset signal RST_X is inputted from the input terminal RS1 to the trigger signal processing circuit TG1 and the count circuit CT1, those circuits are reset to an initial state.

Next, the high level trigger signal "trig" is inputted from the input circuit IN1 to the clock gating circuit CG1, the trigger signal processing circuit TG1, and the count circuit CT1.

On the other hand, when the system clock signal "sysclk" is inputted from the input terminal CLK to the clock gating circuit CG1, the clock gating circuit CG1 detects a high level of the trigger signal "trig", and outputs an internal clock signal "clkin" to the trigger signal processing circuit TG1 and the count circuit CT1. It is to be noted that the internal clock signal "clkin" refers to a clock signal which is used to count an elapsed time.

At this point in time, the count circuit CT1 is supplied with the high level trigger signal "trig" to stay in the reset state continuously and, therefore, abstains from counting the internal clock signal "clkin" as long as the trigger signal "trig" stays at the high level.

The trigger signal processing circuit TG1 detects an input of the high level trigger signal "trig" in synchronization with the internal clock signal clokin, and outputs the signal "output" to the trigger signal processing circuit TG1, the clock gating circuit CG1, and the output terminal OUT1. In the present embodiment, the signal "output" corresponds to, for example, the first signal.

Subsequently, the trigger signal "trig" changes from the high level to the low level. In this case also, the clock gating circuit CG1 detects the signal "output" in synchronization with the system clock signal "sysclk" and, therefore, continues to output the internal clock signal "clkin".

On the other hand, in response to a change of the trigger signal "trig" to the low level, the count circuit CT1 start count up, and outputs a count value "count" to the time set-up circuit TS1. When the count value "count" reaches a predetermined value that corresponds to a predetermined time which is set beforehand to the time set-up circuit TS1, the time set-up circuit TS1 generates the one-shot pulse "AA" and outputs it to the output terminal OU2 and the trigger signal processing circuit TG1. The one-shot pulse "AA" corresponds to, for example, the second signal in the present embodiment.

Next, when the one-shot pulse "AA" is supplied, the trigger signal processing circuit TG1 changes the level of the signal "output" to LOW. The low level signal "output" is applied to the clock gating circuit CG1, which in turn stops outputting the internal clock signal "clkin". The output of the internal clock signal "clkin" to the trigger signal processing circuit TG1 and the count circuit CT1 is stopped with above mentioned.

According to the present embodiment, by the internal clock signal "clkin" inputted to the trigger signal processing circuit TG1 and the count circuit CT1 only in a necessary case, it is possible to operate those circuits only during a necessary time. According to the present embodiment, it is possible to reduce dissipation power of the trigger signal detection apparatus in a simple constitution also. The effects of reducing the dissipation power with above mentioned manner will increase as the set-up time increases.

Control is conducted so that in gating of clock signal outputs to the count circuit CT1, the clock signal outputs may start when the clock gating circuit CG1 has detected an input of the high level trigger signal "trig". Therefore, it is unnecessary to input the clock enable signal from an outside. This eliminates the necessity of adding a circuit for, for example, generating the enable signal, so that an increase in area of the apparatus can be prevented.

Example 1

A description will be given in more detail of the trigger signal detection apparatus shown in FIG. 1 with reference to a specific circuit diagram. A circuit shown in FIG. 2 is one example of the input circuit IN1, the clock gating circuit CG1, the trigger signal processing circuit TG1, and the count circuit CT1 in the trigger signal detection apparatus shown in FIG. 1.

The input circuit IN1 has an input terminal AI1 to which an analog signal AS is applied and a digital filter DF1 to convert the analog signal AS received from the input terminal AI1 into a digital signal trig and output it.

The clock gating circuit CG1 comprises an OR circuit OR1, a latch circuit LT1, and an AND circuit AN1. The trigger signal processing circuit TG1 has an OR circuit OR2, an NAND circuit NAND1, and a flip-flop FF1. Additionally, the count circuit CT1 has an AND circuit AN2 and a 10-bit counter C1.

Figure 2:
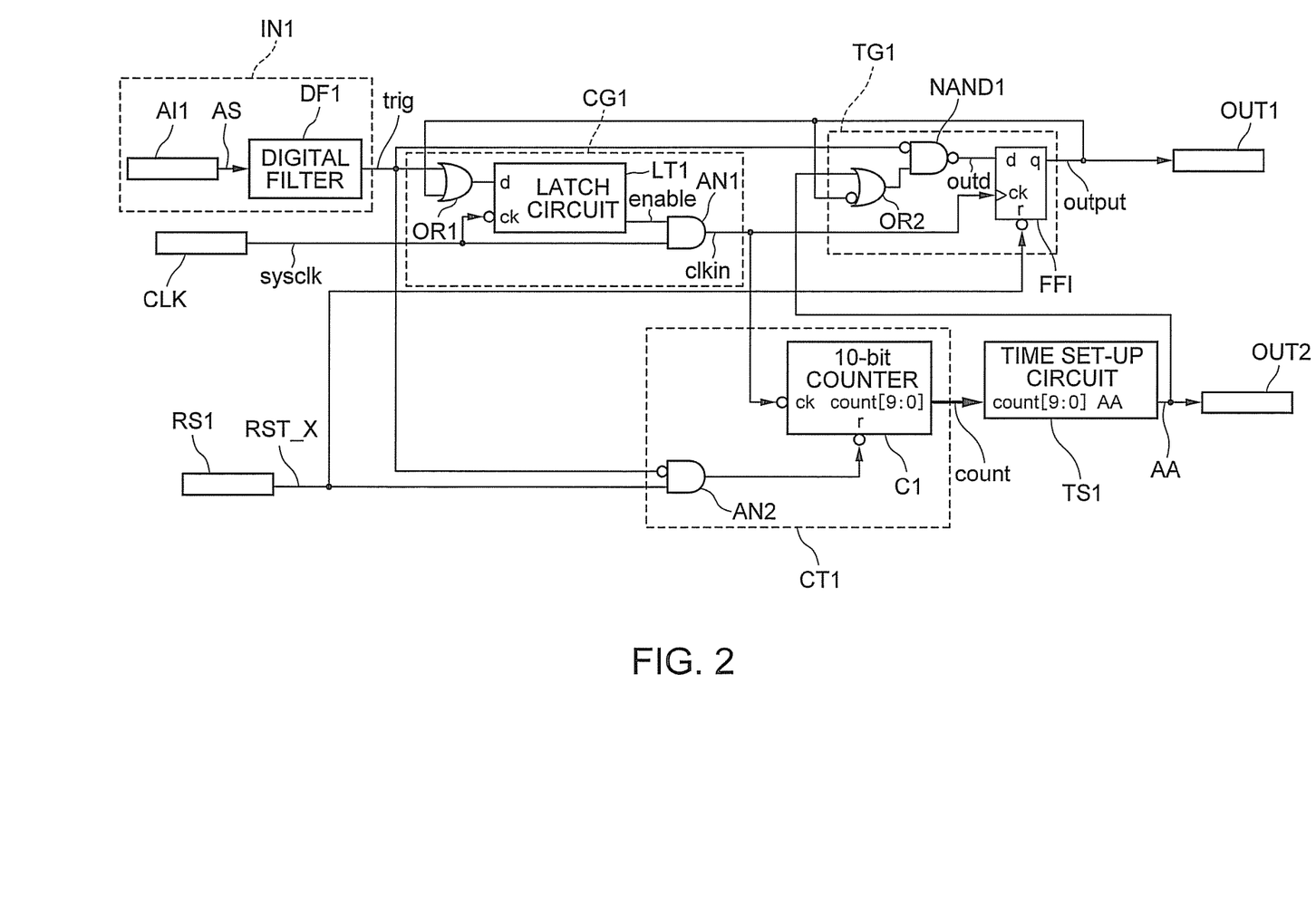
FIG. 2 is a circuit diagram showing a specific constitution of the trigger signal detection apparatus shown in FIG. 1.
Figure 3:
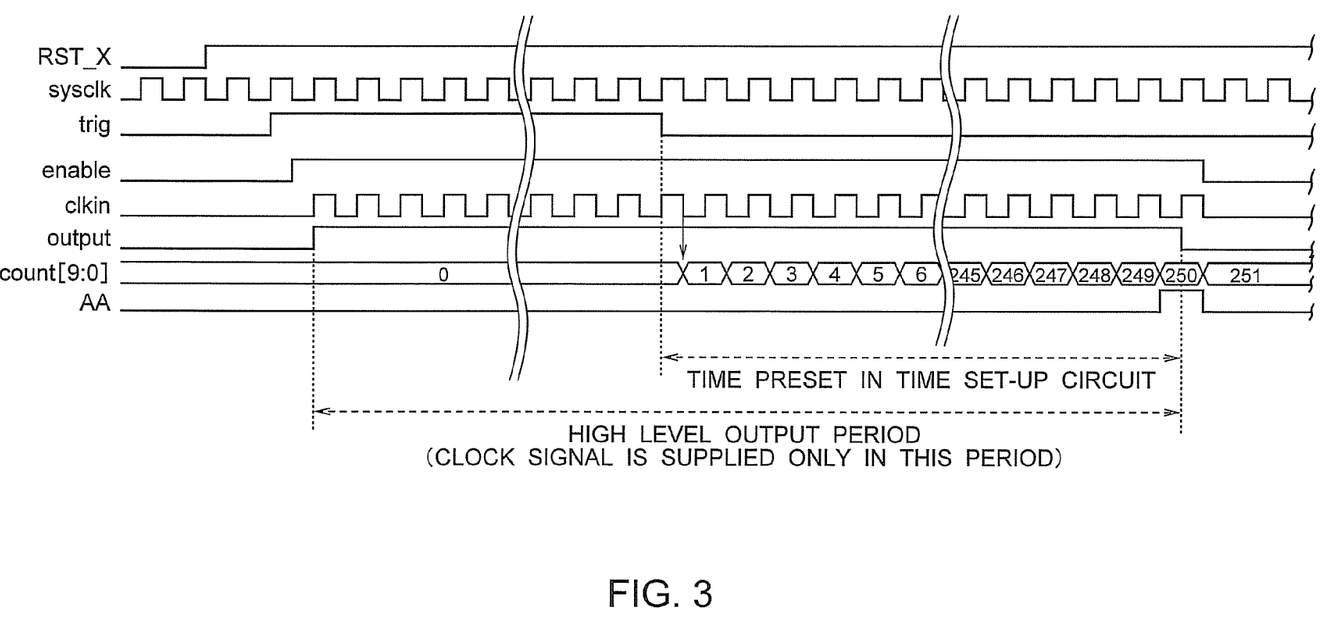
FIG. 3 is a timing chart showing waveforms of various signals in the trigger signal detection apparatus shown in FIG. 2.

FIG. 3 shows a timing chart of signals in the circuits shown in FIG. 2, specifically, the reset signal RST_X, the system clock signal "sysclk", the trigger signal "trig", the enable signal "enable", the internal clock signal "clkin", the signal output, the 10-bit count value [9:0], and the one-shot pulse "AA".

Next, a description will be given of operations of the circuits shown in FIG. 2.

First, the low level reset signal RST_X is inputted from the input terminal RS1 to the flip-flop FF1 and, via the AND circuit AN2, to the 10-bit counter C1 also. When supplied with the low level reset signal RST_X, the flip-flop FF1 is reset. The 10-bit counter C1 is also reset as it is supplied with the low level reset signal RST_X. Then, the reset signal RST_X turns high in level, thereby the trigger signal detection apparatus is activated.

Next, the trigger signal "trig" is inputted via the OR circuit OR1 to the latch circuit LT1 and, via the AND circuit AN2, to the 10-bit counter C1 and further, via the NAND circuit NAND1, also to the flip-flop FF1 as a signal "outd".

Since the trigger signal "trig" is inputted to the 1-bit counter C1, during a period in which the trigger signal "trig" remains high in level, the 10-bit counter C1 stays in the reset state continuously, thus abstaining from starting the counting of the internal clock signal "clkin".

On the other hand, the latch circuit LT1 detects the high level of the trigger signal "trig" at a trailing edge of the system clock signal "sysclk", generates the high level enable signal "enable" and outputs it to the AND circuit AN1. When supplied with the high level enable signal "enable" and the system clock signal "sysclk", the AND circuit AN1 generates the internal clock signal "clkin" and outputs it to the 10-bit counter C1 and the flip-flop FF1.

The flip-flop FF1 latches the signal "outd" received from the NAND circuit NAND1 at a leading edge of the internal clock signal "clkin" applied from the AND circuit AN1 and then outputs it as the high level signal output to the OR circuits OR1 and OR2 and the output terminal OUT1.

It is to be noted that when the trigger signal "trig" is changed from the high level to the low level, the AND circuit AN2 provides a high level output, whose negative logic level is in turn input to the 10-bit counter C1, thereby releasing the 10-bit counter C1 from the reset state.

On the other hand, since the OR circuit OR1 is supplied with the output signal "output", the output signal "output" remains at the high level, so the AND circuit AN1 still continues to output the internal clock signal "clkin". Therefore, after released from the reset state, the 10-bit counter C1 starts counting the internal clock signal "clkin" with the internal clock signal "clkin", and outputs count values "count" of its 0'th bit to 9'th bit to the time set-up circuit TS1. When the count value "count" inputted to the time set-up circuit TS1 reaches a predetermined value ("250" in the present example), the time set-up circuit TS1 generates the one-shot pulse "AA" and outputs the one-shot pulse "AA" to the OR circuit OR2 and the output terminal OUT2.

As the one-shot pulse "AA" is inputted to the OR circuit OR2, the level of the signal "outd" being provided from the NAND circuit NAND1 is inverted from the high level to the low level. When supplied with the low level signal "outd", the flip-flop FF1 latches the low level of the signal "outd" at the leading edge of the internal clock signal "clkin" and outputs the low level signal output to the OR circuits OR1 and OR2 and the output terminal OUT1.

In such a manner, the trigger signal detection apparatus according to the present example provides the high level signal output when supplied with the high level trigger signal "trig" and continues to do so until the arbitrarily set-up time elapses even after the level of the trigger signal "trig" is changed from the high level to the low level.

When the level of the signal output is changed to the low level after this set-up time has elapsed, the output of the OR circuit OR1 is also changed to the low level, so the enable signal "enable" is also changed to the low level as latched by the latch circuit LT1 at the trailing edge of the system clock signal "sysclk". As the result, the internal clock signal "clkin" is blocked by the AND circuit AN1, and also blocked the output to the 10-bit counter C1.

Figure 4:
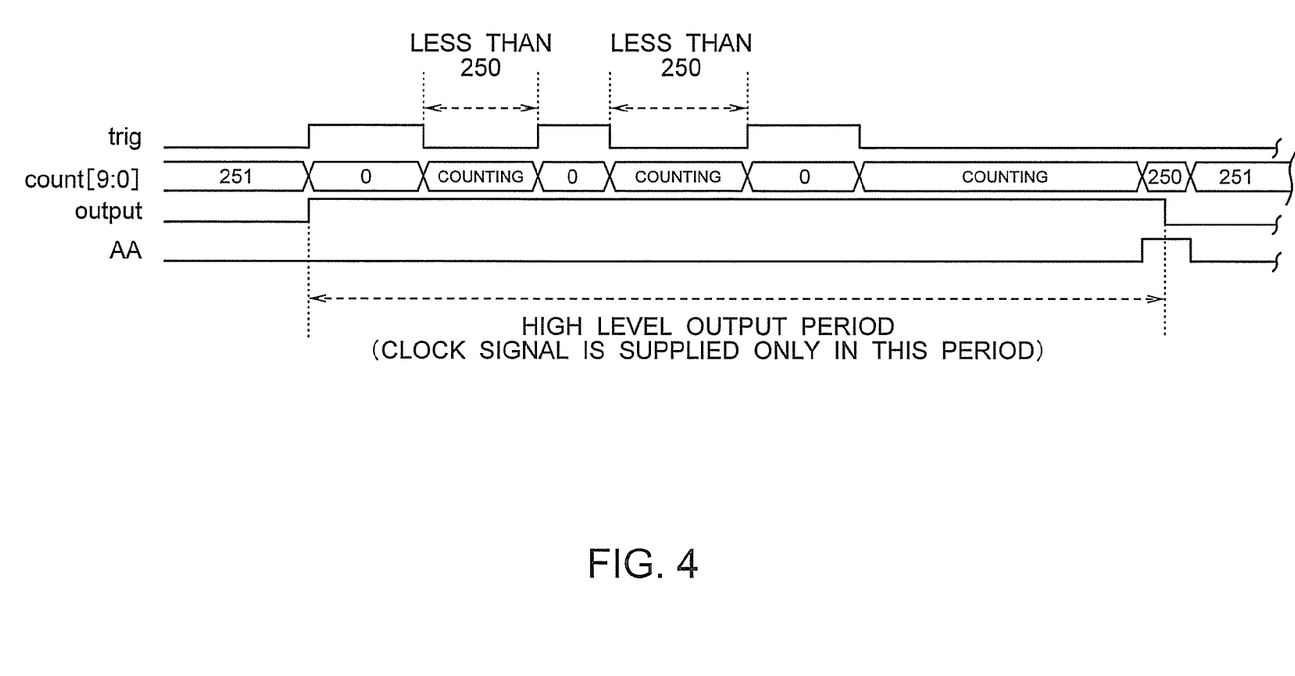
FIG. 4 is a timing chart in a case where a trigger signal is inputted again, before a predetermined count value is reached, into the trigger signal detection apparatus shown in FIG. 2.

It is to be noted that when the high level trigger signal "trig" is inputted again from the input circuit IN1 before the one-shot pulse "AA" is outputted from the time set-up circuit TS1 before the count value "count" has reached the predetermined value (250 in the present example), the trigger signal "trig" is inputted via the AND circuit AN2 to the 10-bit counter C1, and the 10-bit counter C1 is rest. The 10-bit counter C1 abstains from starting count up although the 10-bit counter C1 is supplied with the high level internal clock signal "clkin" from the latch circuit LT1. Then, when the level of the trigger signal "trig" is changed from the high level to the low level, the 10-bit counter C1 restarts count up and outputs the count value "count" to the time set-up circuit TS1. This series of operations will be repeated when the high level trigger signal "trig" is inputted again from the input circuit IN1 to the 10-bit counter C1 before the count value "count" reaches the predetermined value (250 in the present example). That is, when the count value "count" reaches the predetermined value (250 in the present example), the level of the signal "output" provided from the flip-flop FF1 is changed to the low level, and the one-shot pulse "AA" is outputted from the time set-up circuit TS1. FIG. 4 shows a timing chart of the trigger signal "trig", the 10-bit count value [9:0], the signal "output", and the one-shot pulse "AA" in these cases.

In such a manner, according to the present example 1, the internal clock signal "clkin" is inputted to the trigger signal processing circuit TG1 and the count circuit CT1, so the operating time of the trigger signal processing circuit TG1, the count circuit CT1, and the time set-up circuit TS1 will be limited to the time within which the enable signal "enable" is high in level. More specifically, the trigger signal processing circuit TG1, the count circuit CT1, and the time set-up circuit TS1 will operate only in a limited period from the point of time when the trigger signal "trig" is detected by the latch circuit LT1 as the input signal, and changes the level of the output signal "output" of the flip-flop FF1 to the high level, up to when the one-shot pulse "AA" is outputted from the time set-up circuit TS1. Thus, the dissipation power is reduced. The count circuit CT1 and the time set-up circuit TS1 tend to increase in circuit scale as the time set up by the time set-up circuit TS1 becomes longer, thus the dissipation power reducing effects are further increasing.

Moreover, the enable signal "enable" required in control of the gating of the internal clock signal "clkin" to the trigger signal processing circuit TG1 and the count circuit CT1 is generated inside the trigger signal detection apparatus, so the enable signal "enable" is not need to be taken in from the other outside apparatus. This eliminates the necessity of mounting an enable signal generation circuit outside the apparatus, thus enabling a decrease in the circuit scale just by that much.

(2) Second Embodiment

In the aforesaid first embodiment, the counter C1 starts count up when a change in level of the trigger signal "trig", for example, from the high level to the low level, is detected (hereinafter, referred to as "level detection system"). However, there is another desired case of starting the count up by the counter C1 when an edge, for example, a leading edge of the trigger signal "trig" is detected (hereinafter referred to as "edge detection system"). A description will be given below of an embodiment that can accommodate both of the level detection system and the edge detection system.

Figure 5:
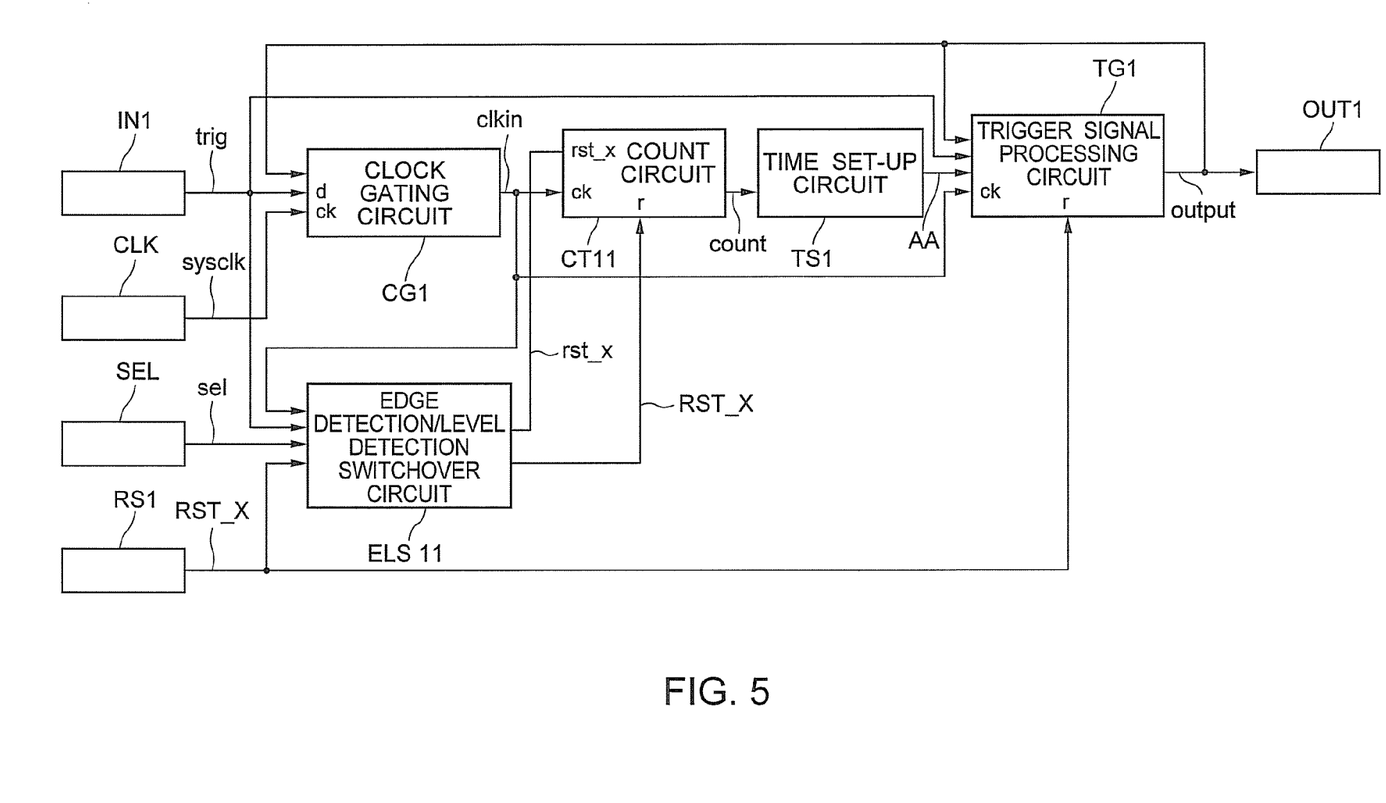
FIG. 5 is a block diagram showing an outlined constitution of a trigger signal detection apparatus according to a second embodiment of the present invention.

FIG. 5 is a block diagram showing an outlined constitution of a trigger signal detection apparatus according to a second embodiment of the present invention. As may be clear from comparison to FIG. 1, the trigger signal detection apparatus shown in FIG. 5 includes a count circuit CT11 instead of the count circuit CT1 shown in FIG. 1, an input terminal SEL and an edge detection/level detection switchover circuit ELS11 that switches between the level detection system and the edge detection system at the time of starting count up by the count circuit CT11. A counter reset signal rst_x is supplied to the count circuit CT11. A select signal sel is supplied to the input terminal SEL.

On the other hand, the trigger signal detection apparatus shown in FIG. 5 has only the output terminal OUT1, not the output terminal OUT2, as its output terminals. Thus, the one-shot pulse "AA" generated by the time set-up circuit TS1 is outputted to only the trigger signal processing circuit TG1. The other components of the trigger signal detection apparatus shown in FIG. 5 are essentially the same as those of the trigger signal detection apparatus shown in FIG. 1. Therefore, in the following, a description will be given of the trigger signal detection apparatus of the present embodiment mainly about the operations of the edge detection/level detection switchover circuit ELS11.

First, when the high level select signal sel is inputted from the input terminal SEL, the level detection system is selected.

The edge detection/level detection switchover circuit ELS11 supplies the count circuit CT11 with the reset signal RST_X received from the input terminal RS1. In this case, the trigger signal detection apparatus of the present embodiment operates essentially in the same way as the aforesaid trigger signal detection apparatus of the first embodiment, and repetitive description on their operations will not be repeated.

On the other hand, when the low level select signal sel is inputted from the input terminal SEL, the edge detection system is selected.

First, the reset signal RST_X inputted from the input terminal RS1 is applied to the trigger signal processing circuit TG1 and also to the count circuit CT11 via the edge detection/level detection switchover circuit ELS11. Thus, the trigger signal processing circuit TG1 and the count circuit CT11 are reset to their initial states.

When the high level trigger signal "trig" is inputted from the input circuit IN1 and applied to the clock gating circuit CG1, the clock gating circuit CG1 detects the high level of the trigger signal "trig" and outputs the internal clock signal "clkin" to the trigger signal processing circuit TG1, the count circuit CT11, and the edge detection/level detection switchover circuit ELS11.

When the trigger signal "trig" is inputted to the trigger signal processing circuit TG1, the trigger signal processing circuit TG1 detects the leading edge of the trigger signal "trig" in synchronization with the internal clock signal "clkin" and provides the signal output to the trigger signal processing circuit TG1, the clock gating circuit CG1, and the output terminal OUT1. In the present embodiment, the signal output corresponds to, for example, the first signal.

When the edge detection/level detection switchover circuit ELS11 receives the high level trigger signal "trig" from the input circuit IN1 and receives the internal clock "clkin" from the clock gating circuit CG1, the edge detection/level detection switchover circuit ELS11 supplies the count circuit CT11 with the counter reset signal rst_x which corresponds to half a pulse of the internal clock signal "clkin", by synchronizing the high level trigger signal "trig" with the internal clock "clkin". Thus, the count circuit CT11 is reset in a synchronous manner, starts count up and outputs the count value "count" to the time set-up circuit TS1. In the present embodiment, the counter reset signal rst_x corresponds to, for example, a third signal. The time set-up circuit TS1 generates the one-shot pulse "AA" when the received count value "count" has become equal to a preset value (count value), and outputs this pulse to the trigger signal processing circuit TG1. The one-shot pulse "AA" corresponds to, for example, the second signal in the present embodiment.

When the one-shot pulse "AA" is supplied to the trigger signal processing circuit TG1, the trigger signal processing circuit TG1 provides the low level signal output to the trigger signal processing circuit TG1, the clock gating circuit CG1, and the output terminal OUT1. When the low level signal output is supplied to the clock gating circuit CG1, the clock gating circuit CG1 stops outputting the internal clock signal "clkin". Thus, the output of the internal clock signal "clkin" is stopped to the count circuit CT11, the trigger signal processing circuit TG1, and the edge detection/level detection switchover circuit ELS11.

In such a manner, according to the present embodiment, by outputting the internal clock signal "clkin" to the trigger signal processing circuit TG1, the edge detection/level detection switchover circuit LES11, and the count circuit CT11 only in a necessary case, it is possible to operate those circuits only in a necessary time. Therefore, dissipation power of the trigger signal detection apparatus can be reduced. The effects of reducing the dissipation power will increase as the set-up time increases.

Furthermore, in gating of clock signal outputs to the count circuit CT11, control is conducted in such a manner that the clock signal outputs may start when the clock gating circuit CG1 has detected an input of the trigger signal "trig". Thus, there is no need to input the clock enable signal from outside of the apparatus. This eliminates the necessity of adding a circuit for, for example, generating the enable signal. Accordingly, an increase in scale of the apparatus can be prevented.

Example 2

A description will be given in more detail of the trigger signal detection apparatus shown in FIG. 5 with reference to a specific circuit diagram. A circuit shown in FIG. 6 is one example of the input circuit IN1, the clock gating circuit CG1, the count circuit CT11, the trigger signal processing circuit TG1, and the edge detection/level detection switchover circuit ELS11 in the trigger signal detection apparatus shown in FIG. 5 take shapes.

Figure 6:
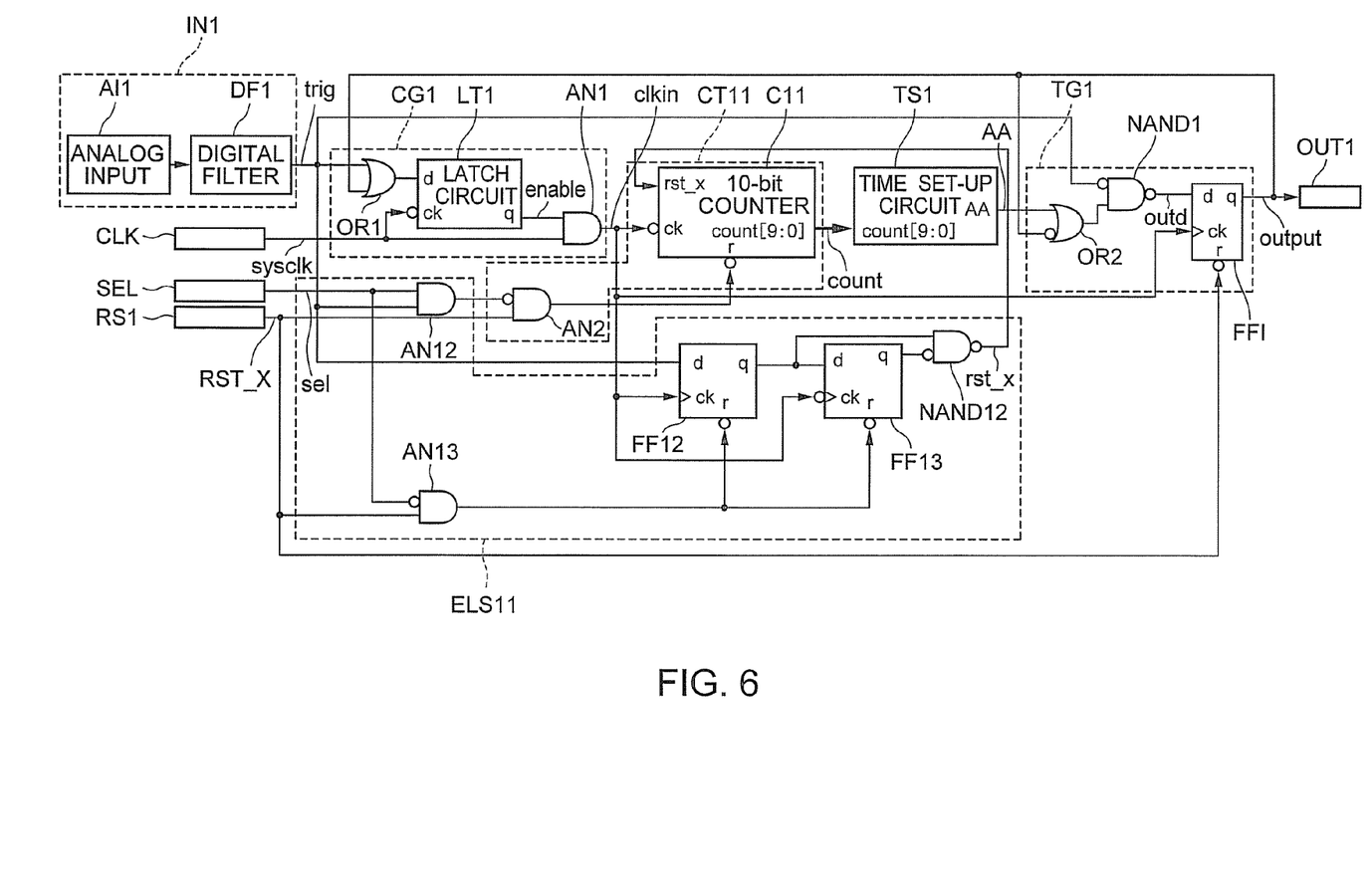
FIG. 6 is a circuit diagram showing a specific constitution of the trigger signal detection apparatus shown in FIG. 5.

Of these circuits shown in FIG. 6, the input circuit IN1, the clock gating circuit CG1, and the trigger signal processing circuit TG1 have the same specific constitutions as those of the circuits shown in FIG. 2. The count circuit CT11 is different from the count circuit CT1 of FIG. 2 in that the count circuit CT11 includes a 10-bit counter C11 having an rst_x input terminal to which the counter reset signal rst_x is to be inputted, instead of the 10-bit counter C1 shown in FIG. 2.

The edge detection/level detection switchover circuit ELS11 has an AND circuits AN12 and AN13, flip-flop circuits FF12 and FF13, and an NAND circuit NAND12.

Figure 7:
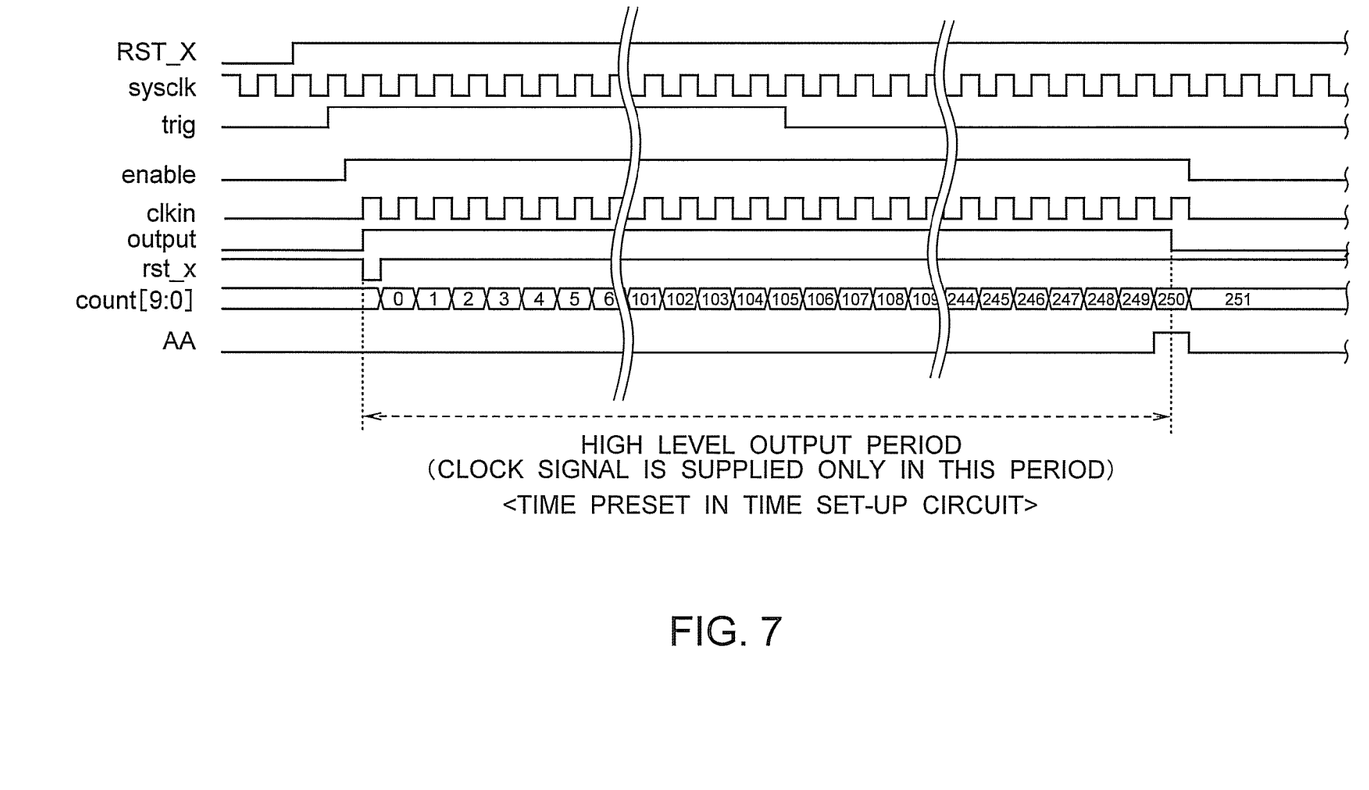
FIG. 7 is a timing chart showing waveforms of various signals in the trigger signal detection apparatus shown in FIG. 6.

FIG. 7 shows a timing chart of the signals in the circuits shown in FIG. 6, specifically, the reset signal RST_X, the system clock signal "sysclk", the trigger signal "trig", the enable signal "enable", the internal clock signal "clkin", the signal output, the counter reset signal rst_x, the 10-bit count value [9:0], and the one-shot pulse "AA".

Next, a description will be given of operations of the trigger signal detection apparatus shown in FIG. 6.

The description is based on the assumption that the trigger signal "trig" should be high in level for a time that is not less than one clock pulse of the system clock signal "sysclk" and not longer than a time preset in the time set-up circuit TS1.

First, the low level reset signal RST_X is inputted to the flip-flop FF1 and is also inputted, via the AND circuit AN2, to the 10-bit counter C11. Thus, the flip-flop circuit FF1 and the 10-bit counter C11 are reset. Then, the reset signal RST_X turns high in level, thereby the trigger signal detection apparatus is activated.

When the high level select signal sel is applied from the input terminal SEL, the level detection system is selected. The trigger signal detection apparatus of the present example operates in the same way as that of Example 1 described above.

When the low level select signal sel is applied from the input terminal SEL, the edge detection system is selected. When the level of the reset signal RST_X supplied from the input terminal RS1 turns high after the negative logic level of the select signal sel is inputted to the AND circuit AN13, the high level signal is inputted to the flip-flops FF12 and FF13. Thus, those flip-flops are reset.

The trigger signal "trig" is inputted via the OR circuit OR1 to the latch circuit LT1 and inputted, via the NAND circuit NAND1, to the flip-flop FF1 as the signal "outd" and also inputted to the flip-flop FF12 and further to the AND circuit AN12. The latch circuit LT1 detects the high level of the trigger signal "trig" at a trailing edge of the system clock signal "sysclk" and then outputs the enable signal "enable" to the AND circuit AN1. Thus, the internal clock signal "clkin" is outputted from the AND circuit AN1 to the flip-flop FF1 in the trigger signal processing circuit TG1, the flip-flops FF12 and FF13 in the edge detection/level detection switchover circuit ELS11, and the 10-bit counter C11.

Furthermore, when the flip-flop FF1 is supplied with the internal clock signal "clkin" from the AND circuit AN1, the flip-flop FF1 latches the signal "outd" at the leading edge of the internal clock signal "clkin" and then outputs the latched signal as the output signal "output" to the OR circuits OR1 and OR2 and the output terminal OUT1.

On the other hand, the flip-flop FF12 latches the trigger signal "trig" at the leading edge of the first pulse of the internal clock signal "clkin", and the low level counter reset signal rst_x is then outputted to the 10-bit counter C11 via the flip-flop FF13 and the NAND circuit 12 by as much as half a pulse of the internal clock signal "clkin". The 10-bit counter C11 is synchronously reset at the trailing edge of the counter reset signal rst_x, and starts count up from 0. In such a manner, when the edge detection system is selected in the present example, in contrast to Example 1, no time lag occurs from the point of time when the AND circuit AN1 is supplied with the enable signal "enable" and the internal clock signal "clkin" is outputted from the AND circuit AN1, to the point of time when the counter starts count up.

The 10-bit counter C11 supplies the time set-up circuit TS1 with the count value "count" of its 0'th bit to 9'th bit until this count value "count" reaches a predetermined value ("250" in the present example), whereupon the time set-up circuit TS1 outputs the one-shot pulse "AA" to the OR circuit OR2. Thus, the signal "outd" provided from the AND circuit AN2 is inverted from the high level to the low level. In the result, the low level of the signal "outd" is latched by the flip-flop FF1 at the leading edge of the internal clock signal "clkin". Thus, the low level signal output is outputted from the flip-flop FF1 to the OR circuits OR1 and OR2 and the output terminal OUT1.

In such a manner, the trigger signal detection apparatus according to the present example provides the high level signal output when supplied with the high level trigger signal "trig" and continues to do so until the arbitrarily set-up time elapses even after the level of the trigger signal "trig" is changed from the high level to the low level. When the level of the signal output is changed to the low level, the output of the OR circuit OR1 is also changed to the low level. Thus, the enable signal "enable" is also changed to the low level as it is latched at the trailing edge of the system clock signal "sysclk". In the result, the internal clock signal "clkin" is blocked by the AND circuit AN1, and the output to the 10-bit counter C11 is stopped.

Figure 8:
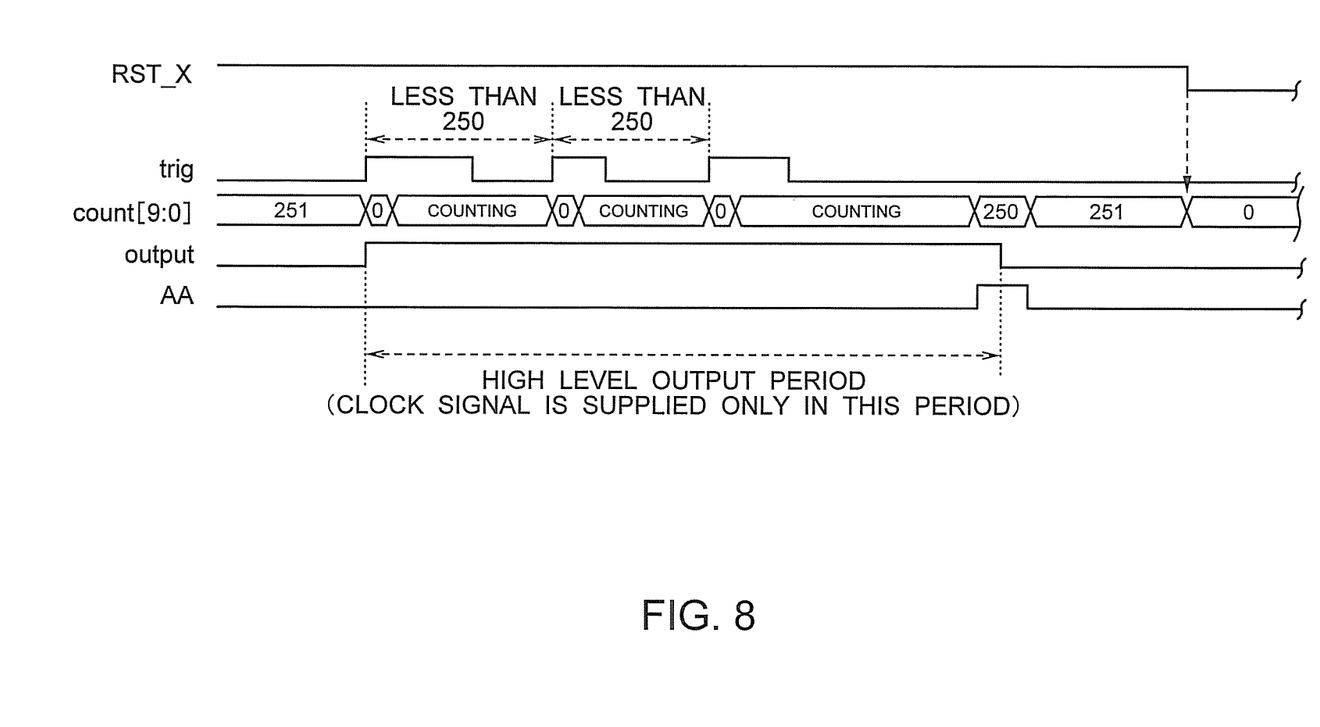
FIG. 8 is a timing chart in a case where the trigger signal is inputted again, before a predetermined count value is reached, into the trigger signal detection apparatus shown in FIG. 6.

It is to be noted that if the trigger signal "trig" is inputted again from the digital filter DF1 before the count value "count" has reached the predetermined value (250 in the present example) and the one-shot pulse "AA" is outputted from the time set-up circuit TS1, the high level enable signal "enable" is generated by the latch circuit LT1 and the counter C11 is supplied with the low level counter reset signal rst_x from the NAND circuit 12, and thus the count value "count" is cleared, which operation is immediately followed by the 10-bit counter C11 restarting count up. These operations are repeated when the trigger signal "trig" is inputted again before the count value "count" reaches the predetermined value (250 in the present example). When the count value "count" reaches the predetermined value (250 in the present example), the one-shot pulse "AA" is outputted from the time set-up circuit TS1, thus the level of the signal output to the low level is changed. FIG. 8 shows a timing chart of the reset signal RST_X, the trigger signal "trig", the 10-bit count value [9:0], the signal output, and the one-shot pulse "AA" in these cases.

In such a manner, according to the present example 2, the internal clock signal "clkin" is inputted to the trigger signal processing circuit TG1, the edge detection/level detection switchover circuit ELS11, and the count circuit CT11, the operation time of the trigger signal processing circuit TG1, the count circuit CT11, the time set-up circuit TS1, and the edge detection/level detection switchover circuit ELS11 is limited to a time period within which the enable signal "enable" is high in level. More specifically, the trigger signal processing circuit TG1, the count circuit CT11, the time set-up circuit TS1, and the edge detection/level detection switchover circuit ELS11 will operate only in a limited period from the point of time when the incoming trigger signal "trig" is detected by the latch circuit LT1 and the level of the output signal "output" of the flip-flop FF1 is changed to the high level, up to the point of time when the one-shot pulse "AA" is outputted from the time set-up circuit TS1. Thus, the dissipation power is reduced. Since the count circuit CT11 and the time set-up circuit TS1 tend to increase in circuit scale as the time set up by the time set-up circuit TS1 becomes longer, the dissipation power reducing effects according to the present example is further increased.

Moreover, the enable signal "enable" required in control of the gating of the internal clock signal "clkin" to the trigger signal processing circuit TG1 and the count circuit CT11 is generated inside the trigger signal detection apparatus and thus need not be taken in from the outside of the apparatus. This eliminates the necessity of mounting an enable signal generation circuit outside the apparatus. Accordingly, a decrease in the circuit scale is accomplished by just that much.

Although the present invention has been described with reference to its embodiments, it is to be understood that the present invention is not limited to these embodiments whatsoever and, of course, various modification can be implemented within the scope thereof.

For example, although the above embodiments have been arranged to generate and output the one-shot pulse "AA" when the count value "count" has reached the predetermined value in the time set-up circuits TS1, the present invention is not limited to it; the high level signal may be generated instead.

Example 2 has been arranged to apply the counter reset signal rst_x corresponding to half a pulse of the internal clock signal "clkin" to the rst_x input terminal of the count circuit CT11, the present invention is not limited to it; the counter reset signal may be outputted by as much as one pulse of the internal clock signal "clkin". In this case, the internal clock signal "clkin" may be inputted to the flip-flop FF13 as it is, not in a condition where it is inverted.

What is claimed is:
1. A trigger signal detection apparatus comprising:
   a clock gating circuit which is supplied with a trigger signal and a clock signal and outputs the clock signal;
   a trigger signal processing circuit which outputs a first signal only for a predetermined time when the clock signal is supplied from the clock gating circuit;
   a counter which operates in response to cancellation of the trigger signal, thus outputting a count value of the clock signal; and a time set-up circuit which outputs a second signal to the trigger signal processing circuit when count value supplied from the counter reaches a preset value, wherein the trigger signal processing circuit stops outputting the first signal when the trigger signal processing circuit receives the second signal, the counter is reset when the counter is supplied with the trigger signal and, when the trigger signal is canceled, the counter is released from the reset state and starts counting the clock signal, and the first signal keeps outputting from the trigger signal processing circuit exclusively during a time period from the supply of the clock from the outside into the trigger signal processing circuit until the input of the second signal into the trigger signal processing circuit.

2. A trigger signal detection apparatus comprising:

a clock gating circuit which is supplied with a trigger signal and a clock signal and outputs the clock signal;

a trigger signal processing circuit which outputs a first signal only for a predetermined time when the clock signal is supplied from the clock gating circuit;

a counter which operates in response to cancellation of the trigger signal, thus outputting a count value of the clock signal; and a time set-up circuit which outputs a second signal to the trigger signal processing circuit when count value supplied from the counter reaches a preset value, wherein the trigger signal processing circuit stops outputting the first signal when the trigger signal processing circuit receives the second signal, the counter is reset when the counter is supplied with the trigger signal between a point of time when the counter starts operating and a point of time when the count value reaches the preset value and, when the trigger signal is canceled, the counter is released from the reset state and restarts operating, and the first signal keeps outputting from the trigger signal processing circuit exclusively during a time period from the supply of the clock from the outside into the trigger signal processing circuit until the input of the second signal into the trigger signal processing circuit.

\* \* \* \* \*